(12) United States Patent
Tanaka et al.

(10) Patent No.: US 7,637,143 B2
(45) Date of Patent: Dec. 29, 2009

(54) SUBSTRATE PROCESSING APPARATUS AND ANALYSIS METHOD THEREFOR

(75) Inventors: Hideki Tanaka, Nirasaki (JP); Susumu Saito, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 226 days.

(21) Appl. No.: 11/931,145

(22) Filed: Oct. 31, 2007

(65) Prior Publication Data
US 2008/0110233 A1    May 15, 2008

Related U.S. Application Data

(60) Provisional application No. 60/888,241, filed on Feb. 5, 2007.

(30) Foreign Application Priority Data
Nov. 10, 2006    (JP) .............................. 2006-305844

(51) Int. Cl.
*G01N 21/00* (2006.01)
(52) U.S. Cl. .................................................... 73/23.21
(58) Field of Classification Search ................ 73/23.21, 73/1.06, 23.2
See application file for complete search history.

(56) References Cited

U.S. PATENT DOCUMENTS

| | | | | |
|---|---|---|---|---|
| 5,837,094 A | * | 11/1998 | Tsukazaki et al. | 156/345.25 |
| 6,660,528 B1 | * | 12/2003 | Chen et al. | 436/171 |
| 7,000,454 B2 | * | 2/2006 | Schneider et al. | 73/31.03 |
| 7,376,520 B2 | * | 5/2008 | Wong et al. | 702/45 |
| 7,412,872 B2 | * | 8/2008 | Choi et al. | 73/23.21 |
| 7,424,894 B2 | * | 9/2008 | Lull et al. | 137/9 |
| 7,437,944 B2 | * | 10/2008 | Melcer et al. | 73/861 |
| 2003/0047012 A1 | * | 3/2003 | Storbeck et al. | 73/865.5 |
| 2003/0106494 A1 | * | 6/2003 | Lee et al. | 118/712 |
| 2005/0189074 A1 | * | 9/2005 | Kasai et al. | 156/345.33 |
| 2005/0268694 A1 | * | 12/2005 | Moriya et al. | 73/28.01 |
| 2006/0243060 A1 | * | 11/2006 | Lane et al. | 73/861 |
| 2007/0204702 A1 | * | 9/2007 | Melcer et al. | 73/861 |

FOREIGN PATENT DOCUMENTS

JP    2004-319961    11/2004

* cited by examiner

*Primary Examiner*—John Fitzgerald
(74) *Attorney, Agent, or Firm*—Oblon, Spivak, McClelland, Maier & Neustadt, L.L.P.

(57) ABSTRACT

An analysis method for a substrate processing apparatus capable of accurately detecting a state in a housing chamber. Emission intensities of processing gas before being introduced into the chamber and processing gas having passed therethrough are measured before an inter-chamber part is replaced. If an emission intensity measured after the replacement coincides with that measured before the replacement, an emission intensity of the processing gas having passed through the chamber is measured, and a variation between the emission intensities of the processing gas having passed through the chamber measured before and after the replacement is calculated. After start of plasma processing on wafers, an emission intensity of the processing gas having passed through the chamber is measured and the variation is removed therefrom to calculate an emission intensity really representing a state in the chamber, thus detecting an end point of plasma processing therefrom.

18 Claims, 6 Drawing Sheets

SUBSTRATE PROCESSING APPARATUS AND ANALYSIS METHOD THEREFOR

BACKGROUND OF THE INVENTION

1. Field of the Invention

The present invention relates to a substrate processing apparatus and an analysis method therefor, and more particularly, to a substrate processing apparatus for using gas to analyze a state in the apparatus.

2. Description of the Related Art

A substrate processing apparatus for performing plasma processing on substrates such as semiconductor wafers comprises a housing chamber (hereinafter referred to as the "chamber") for housing a substrate, and performs the plasma processing on the substrate using a plasma generated in the chamber. In order to carry out proper plasma processing on the substrate, it is important to detect a state in the chamber or an end point of the plasma processing.

To detect the state in the chamber or the end point of plasma processing, there is known a method in which a window of quartz glass is fitted into a side wall of the chamber, a plasma spectroanalyzer is disposed such as to face the window, and spectral analysis is performed on plasma emission in the chamber by the spectroanalyzer (see, for example, paragraph [0038] of Japanese Laid-open Patent Publication No. 2004-319961).

However, with elapse of time, the window of the chamber can become clouded. Furthermore, a light receiving sensor provided in the spectroanalyzer must be replaced after passage of predetermined hours of use, and there is sometimes an individual difference in light-receiving performance between the sensor before replacement and the sensor after replacement. The cloud on the window in the chamber and the sensor replacement affect on a result of the spectral analysis by the spectroanalyzer.

Replacement of an inter-chamber part (i.e., a part disposed in the chamber) such as, for example, a sealed ring or a focus ring, can sometimes cause a difference in the state of plasma emission between before and after the replacement, even if recipe (processing condition) is kept unchanged between before and after the replacement. Thus, the plasma emission can be affected by the replacement of the inter-chamber part. In other words, a result of spectral analysis by a spectroanalyzer reflects the influence of the inter-chamber part replacement.

As described above, the result of spectral analysis by the spectroanalyzer does not simply reflect the state in the chamber, but also reflects other variation factors (such as influences of the cloud on the window of the chamber, the sensor replacement, and the inter-chamber part replacement). As a result, the state in the chamber cannot be detected with accuracy.

SUMMARY OF THE INVENTION

The present invention provides a substrate processing apparatus capable of accurately detecting a state in a housing chamber and an analysis method therefor.

According to a first aspect of the present invention, there is provided a substrate processing apparatus including a housing chamber adapted to house a substrate and a gas introduction apparatus adapted to introduce gas into the housing chamber, the housing chamber including a processing space in which predetermined processing is performed on the substrate using the gas, comprising a first gas analysis apparatus adapted to analyze gas before being introduced into the housing chamber, a second gas analysis apparatus adapted to analyze gas having passed through the processing space, and a state detection apparatus adapted to detect a state in the housing chamber based on a result of analysis on the gas before being introduced into the housing chamber and a result of analysis on the gas having passed through the processing space, wherein the state detection apparatus calculates a ratio of the result of analysis performed on the gas having passed through the processing space before execution of the predetermined processing on a plurality of the substrates to the result of analysis performed on the gas before being introduced into the housing chamber before the execution of the predetermined processing on the plurality of the substrates, calculates a ratio of the result of analysis performed on the gas having passed through the processing space after the execution of the predetermined processing on the plurality of the substrates to the result of analysis performed on the gas before being introduced into the housing chamber after the execution of the predetermined processing on the plurality of the substrates, calculates a correction value for correcting the result of analysis performed on the gas having passed through the processing space after the execution of the predetermined processing on the plurality of the substrates such that the ratio before the execution of the predetermined processing on the plurality of the substrates and the ratio after the execution of the predetermined processing on the plurality of the substrates become equal to each other, and calibrates the result of analysis on the gas having passed through the processing space using the calculated correction value.

With the substrate processing apparatus of this invention, a ratio of the result of analysis performed on the gas having passed through the processing space before execution of the predetermined processing on a plurality of the substrates to the result of analysis performed on the gas before being introduced into the housing chamber before the execution of the predetermined processing on the substrates is calculated, a ratio of the result of analysis performed on the gas having passed through the processing space after the execution of the predetermined processing on the substrates to the result of analysis performed on the gas before being introduced into the housing chamber after the execution of the predetermined processing on the substrates is calculated, a correction value for correcting the result of analysis performed on the gas having passed through the processing space after the execution of the predetermined processing on the substrates is calculated such that the ratio before the execution of the predetermined processing becomes equal to the ratio after the execution of the predetermined processing, and the result of analysis on the gas having passed through the processing space is calibrated using the calculated correction value, whereby a state in the housing chamber is detected. The correction value represents influences of deterioration of the first gas analysis apparatus that analyzes gas before being introduced into the housing chamber and influences of a variation in the gas. Accordingly, the influences of deterioration of the first gas analysis apparatus and the variation in the gas can be removed from the result of analysis on the gas having passed through the processing space, making it possible for the result of gas analysis to only represent the state in the housing chamber. As a result, the state in the housing chamber can accurately be detected.

The state detection apparatus can detect an end point of the predetermined processing based on the calibrated result of analysis on the gas having passed through the processing space.

In that case, the end point of the predetermined processing is detected based on the calibrated result of analysis on the gas having passed through the processing space. The calibrated result of gas analysis only represents the state in the housing chamber, and therefore, the state in the housing chamber can accurately be detected.

The substrate processing apparatus can include an exhaust system adapted to exhaust an inside of the housing chamber, and the second gas analysis apparatus can be disposed in the exhaust system.

In that case, the second gas analysis apparatus is disposed in the exhaust system that exhausts the inside of the housing chamber. As a result, the second gas analysis apparatus can be isolated from inside the housing chamber, making it possible to prevent the analysis processing in the second gas analysis apparatus from affecting the predetermined processing or the like performed in the housing chamber.

The housing chamber can have an exhaust plate for preventing the plasma in the processing space from flowing toward a downstream side, the exhaust system can have a high molecular vacuum pump, and the second gas analysis apparatus can be disposed between the exhaust plate and the high molecular vacuum pump.

In that case, the second gas analysis apparatus is disposed between the exhaust plate that prevents plasma in the processing space in the housing chamber from flowing out toward the downstream side and the high molecular vacuum pump in the exhaust system. To allow the high molecular vacuum pump to perform exhaustion, nitrogen gas must be supplied to the downstream of the pump. However, the second gas analysis apparatus is disposed upstream of the high molecular vacuum pump, and therefore, the supplied nitrogen gas does not influence the result of analysis on the gas having passed through the processing space. In addition, the second gas analysis apparatus is disposed downstream of the exhaust plate, and therefore, plasma does not influence on the result of analysis on the gas having passed through the processing space. As a result, the state in the housing chamber can more accurately be detected.

The second gas analysis apparatus can be disposed in the housing chamber.

In that case, the second gas analysis apparatus is disposed in the housing chamber. As a result, it becomes easy for the second gas analysis apparatus to take in gas in the housing chamber, and therefore, the second gas analysis apparatus can easily detect the state in the housing chamber.

At least one of the first and second gas analysis apparatuses can have a gas take-in chamber for taking in gas, a plasma generation apparatus for generating plasma in the gas take-in chamber, and a spectroscopic measurement apparatus for dispersing light emitted from atoms or molecules in the gas excited by the plasma and measuring an emission intensity.

In that case, a plasma for exciting atoms or molecules in the gas is generated, light emitted from the atoms or molecules in the gas excited by the plasma is dispersed, and an emission intensity is measured. Thus, it is possible to measure the concentration of atoms or molecules in the gas from the emission intensity, whereby gas analysis can be carried out with accuracy.

At least one of the first and second gas analysis apparatuses can be a mass analyzer.

In that case, the gas analysis can be carried out with more accuracy, using the mass analyzer.

At least one of the first and second gas analysis apparatuses can be a Fourier transform infrared spectrophotometer.

In that case, the gas analysis can more accurately be performed using the Fourier transform infrared spectrophotometer.

At least one of the first and second gas analysis apparatuses can include a gas pipe through which the gas flows, a plasma generation apparatus for generating plasma in the gas pipe, and a spectroscopic measurement apparatus for dispersing an afterglow appearing downstream of a center part of plasma generation in the gas pipe and measuring an emission intensity.

In that case, an afterglow appearing downstream of the central part of plasma generation in the gas pipe is dispersed, and the emission intensity is measured. Thus, the emission intensity can be measured with accuracy, and the provision of a take-in chamber for taking in gas is unnecessary, making it possible to carry out gas analysis with a low-priced construction.

A substrate transfer apparatus for transferring the substrate into and out of the substrate processing apparatus can be connected to the substrate processing apparatus, and the substrate transfer apparatus can have a gas analysis apparatus for analyzing gas in the substrate transfer apparatus.

In that case, the gas analysis is performed in the substrate transfer apparatus connected to the substrate processing apparatus, making it possible to detect a state in the substrate transfer apparatus.

The substrate transfer apparatus can have a second exhaust system for exhausting gas in the substrate transfer apparatus, and the gas analysis apparatus can be disposed in the second exhaust system.

In that case, the gas analysis apparatus is disposed in the second exhaust system that exhausts gas in the substrate transfer apparatus, whereby the gas analysis apparatus can be isolated from the inside of the substrate transfer apparatus, making it possible to prevent analysis processing performed in the gas analysis apparatus from influencing the inside of the substrate transfer apparatus.

The substrate transfer apparatus can have a second housing chamber for temporarily housing the substrate, and the gas analysis apparatus can be disposed in the second housing chamber.

In that case, the gas analysis apparatus is disposed in the second housing chamber of the substrate transfer apparatus, whereby the gas analysis apparatus can easily take in the gas in the second housing chamber. As a result, it is possible to easily detect the state in the second housing chamber.

According to a second aspect of the present invention, there is provided a substrate processing apparatus having a housing chamber for housing a substrate and a gas introduction apparatus for introducing gas into the housing chamber, the housing chamber having a processing space in which predetermined processing is performed on the substrate using the gas, comprising a first gas analysis apparatus adapted to analyze gas before being introduced into the housing chamber, a second gas analysis apparatus adapted to analyze gas having passed through the processing space, and a state detection apparatus adapted to detect a state in the housing chamber based on a result of analysis on the gas before being introduced into the housing chamber and a result of analysis on the gas having passed through the processing space, wherein the state detection apparatus calculates a variation between the results of analysis performed on the gas having passed through the processing space before and after maintenance of the housing chamber and calibrates the result of analysis on the gas having passed through the processing space using the calculated variation when the result of analysis performed on the gas before being introduced into the housing chamber before the maintenance of the housing chamber is equal to the result of analysis performed thereon after the maintenance of the housing chamber.

In the substrate processing apparatus according to the second aspect of this invention, when the result of analysis performed on the gas before being introduced into the housing chamber before the maintenance of the housing chamber is equal to the result of analysis performed after the maintenance, a variation between the results of analysis performed on the gas having passed through the processing space before and after maintenance of the housing chamber is calculated, and the result of analysis on the gas having passed through the processing space is calibrated using the calculated variation, whereby a state in the housing chamber is detected. When the result of analysis performed on the gas before being introduced into the housing chamber before the maintenance of the housing chamber is equal to the result of analysis performed after the maintenance, a variation between the results of analysis performed on the gas having passed through the processing space before and after maintenance of the housing chamber represents influence of sensor replacement, influence of replacement of inter-housing chamber part, or the like. By calibrating the result of analysis on the gas having passed through the processing space based on the calculated variation, therefore, it is possible for the gas analysis result to only represent the state in the housing chamber. As a result, the state in the housing chamber can be detected with accuracy.

The maintenance of the housing chamber can include replacing parts, cleaning parts, or performing dry cleaning of the housing chamber.

According to a third aspect of the present invention, there is provided an analysis method for a substrate processing apparatus having a housing chamber for housing a substrate and a gas introduction apparatus for introducing gas into the housing chamber, the housing chamber having a processing space in which predetermined processing is performed on the substrate using the gas, comprising a first gas analyzing step of analyzing gas before being introduced into the housing chamber, a second gas analyzing step of analyzing gas having passed through the processing space, and a state detection step of detecting a state in the housing chamber based on a result of analysis on the gas before being introduced into the housing chamber and a result of analysis on the gas having passed through the processing space, wherein the state detection step calculates a ratio of the result of analysis performed on the gas having passed through the processing space before execution of the predetermined processing on a plurality of the substrates to the result of analysis performed on the gas before being introduced into the housing chamber before the execution of the predetermined processing on the plurality of the substrates, calculates a ratio of the result of analysis performed on the gas having passed through the processing space after the execution of the predetermined processing on the plurality of the substrates to the result of analysis performed on the gas before being introduced into the housing chamber after the execution of the predetermined processing on the plurality of the substrates, calculates a correction value for correcting the result of analysis performed on the gas having passed through the processing space after the execution of the predetermined processing on the plurality of the substrates such that the ratio before the execution of the predetermined processing on the plurality of the substrates and the ratio after the execution of the predetermined processing on the plurality of the substrates become equal to each other, and calibrates the result of analysis on the gas having passed through the processing space using the calculated correction value.

With the analysis method according to the third aspect of the present invention, it is possible to attain advantages that are the same as or similar to those attained by the substrate processing apparatus according to the first aspect of this invention.

The state detection step can detect an end point of the predetermined processing based on the calibrated result of analysis on the gas having passed through the processing space.

In that case, it is possible to accurately detect the end point of the predetermined processing.

According to a fourth aspect of the present invention, there is provided an analysis method for a substrate processing apparatus having a housing chamber for housing a substrate and a gas introduction apparatus for introducing gas into the housing chamber, the housing chamber having a processing space in which predetermined processing is performed on the substrate using the gas, comprising a first gas analyzing step of analyzing gas before being introduced into the housing chamber, a second gas analyzing step of analyzing gas having passed through the processing space, and a state detection step of detecting a state in the housing chamber based on a result of analysis on the gas before being introduced into the housing chamber and a result of analysis on the gas having passed through the processing space, wherein the state detection step calculates a variation between the results of analysis performed on the gas having passed through the processing space before and after maintenance of the housing chamber when the result of analysis performed on the gas before being introduced into the housing chamber before the maintenance of the housing chamber is equal to the result of analysis performed thereon after the maintenance of the housing chamber, and calibrates the result of analysis on the gas having passed through the processing space using the calculated variation.

With the analysis method according to the fourth aspect of the present invention, it is possible to attain advantages that are the same as or similar to those attained by the substrate processing apparatus according to the second aspect of the present invention.

The maintenance of the housing chamber can include replacing parts, cleaning parts, or performing dry cleaning of the housing chamber.

Further features of the present invention will become apparent from the following description of exemplary embodiments with reference to the attached drawings.

BRIEF DESCRIPTION OF THE DRAWINGS

FIGS. 4A and 4B are views for explaining a method for calibration of the emission intensity of processing gas in a substrate processing apparatus according to a second embodiment of the present invention, wherein

DETAILED DESCRIPTION OF THE PREFERRED EMBODIMENTS

The present invention will now be described in detail below with reference to the drawings showing preferred embodiments thereof.

First, an explanation will be given of a substrate processing system to which is applied a substrate processing apparatus according to a first embodiment of this invention.

Figure 1:
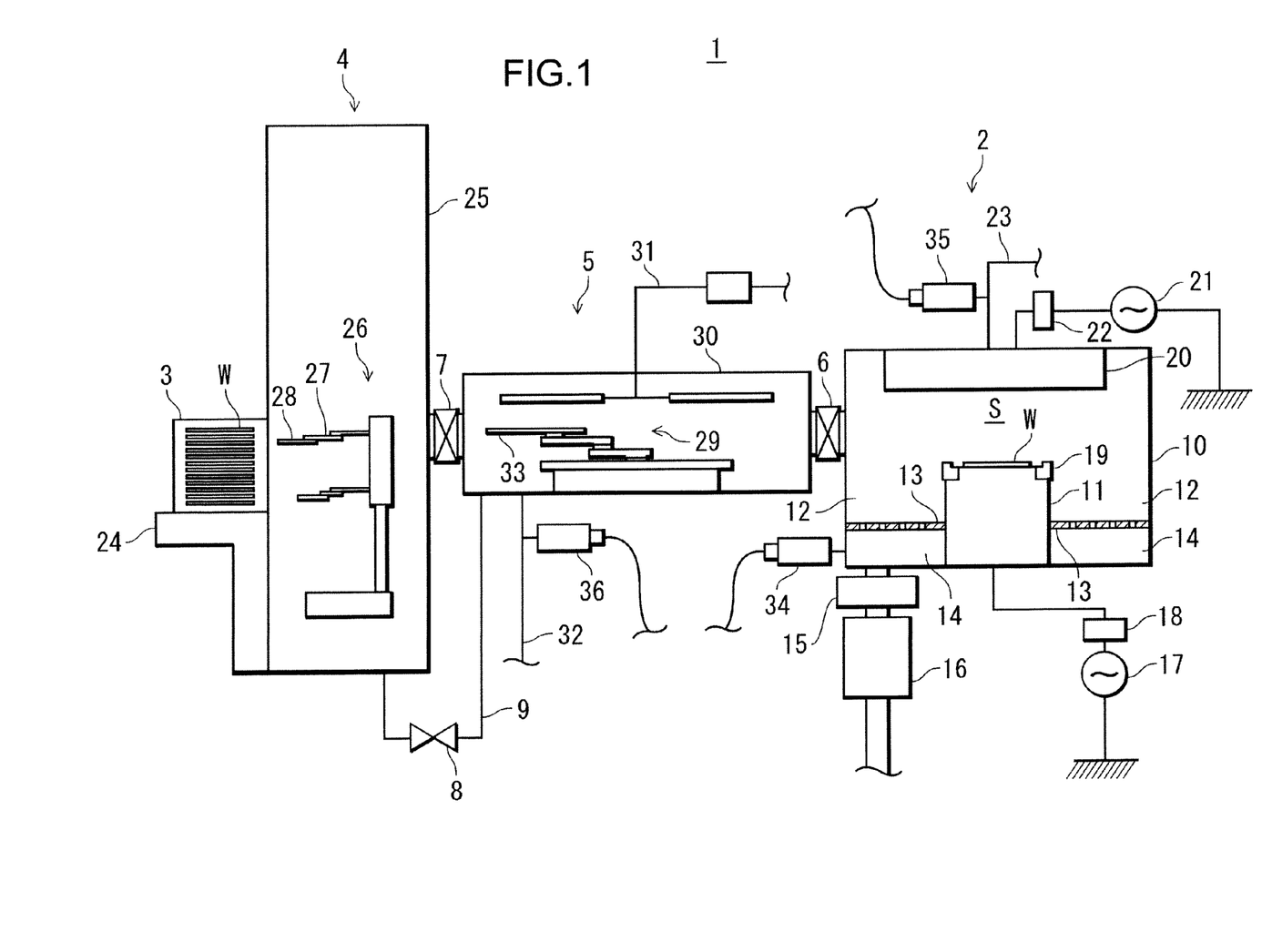
FIG. 1 is a section view schematically showing the construction of a substrate processing system to which is applied to a substrate processing apparatus according to a first embodiment of the present invention.

FIG. 1 is a section view schematically showing the construction of the substrate processing system to which the substrate processing apparatus of this embodiment is applied.

As shown in FIG. 1, the substrate processing system 1 comprises a process module 2 (substrate processing apparatus) for carrying out various plasma processing such as film formation, diffusion, etching on each of semiconductor wafers W (hereinafter referred to as "wafers W") as substrates, a loader module 4 for taking out a wafer W from a wafer cassette 3 adapted to house a predetermined number of wafers W, and a load lock module 5 (substrate transfer apparatus) disposed between the loader module 4 and the process module 2 and adapted to transfer a wafer W from the loader module 4 to the process module 2 or from the process module 2 to the loader module 4.

The process module 2 and the load lock module 5 are configured to be internally vacuumed, and the inside of the loader module 4 is always kept at atmospheric pressure. The process module 2 is connected to the load lock module 5 via a gate valve 6, and the load lock module 5 is connected to the loader module 4 via a gate valve 7. The inside of the load lock module 5 is communicated to the inside of the loader module 4 via a communication pipe 9 in the middle of which an openable/closable valve 8 is disposed.

The process module 2 has a cylindrical chamber 10 (housing chamber) made of metal such as aluminum or stainless steel. Within the chamber 10, there is disposed a column-shaped susceptor 11 as a mounting stage on which a wafer W which has a 300 mm diameter is placed.

Between a side wall of the chamber 10 and the susceptor 11, there is formed an exhaust path 12 functioning as a flow path through which gases in a processing space S, described later, are exhausted to the outside of the chamber 10. An annular flow straightener ring 13 (exhaust plate) is disposed in the middle of the exhaust path 12. A manifold 14, which is a space of the exhaust path 12 located downstream of the flow straightener ring 13, is communicated with an automatic pressure control valve (hereinafter referred to as the "APC valve") 15, which is a variable butterfly valve. The APC valve 15 is connected to a turbo-molecular pump (hereinafter referred to as the "TMP") 16, which is an exhausting pump for evacuation. The flow straightener ring 13 prevents a plasma generated in the processing space S from flowing into the manifold 14. The APC valve 15 controls the pressure in the chamber 10. The TMP 16 depressurizes the inside of the chamber 10 to a substantially vacuum state. The manifold 14, the APC valve 15, and the TMP 16 constitute a process module exhaust system in which the manifold 14 is connected to a second gas analysis unit 34 (second gas analysis apparatus), described later.

A high-frequency power supply 17 is connected via a matcher 18 to the susceptor 11 and adapted to supply high-frequency power to the supply 17, whereby the susceptor 11 functions as a lower electrode. The matcher 18 reduces the reflection of high-frequency power from the susceptor 11, thereby maximizing the efficiency of supply of the high-frequency power to the susceptor 11.

There is disposed on the susceptor 11 an electrode plate (not shown) adapted to attract and hold a wafer W through a Coulomb force or a Johnsen-Rahbek force, whereby the wafer W is attracted to and held on an upper surface of the susceptor 11. Furthermore, an annular focus ring 19 of silicon (Si) is disposed in an upper part of the susceptor 11, and focuses plasma generated in the processing space S between the susceptor 11 and a shower head 20, described below, toward the wafer W.

Inside the susceptor 11, an annular coolant chamber (not shown) is provided, into which a coolant, for example cooling water, at a predetermined temperature is supplied for circulation. A temperature at which the wafer W on the susceptor 11 is processed is adjusted by the temperature of the coolant. Helium gas is supplied to between the wafer W and the susceptor 11, and conveys heat from the wafer W to the susceptor 11.

A disk-shaped shower head 20 is disposed in a ceiling portion of the chamber 10. A high-frequency power source 21 is connected via a matcher 22 to the shower head 20 and supplies high-frequency power to the shower head 20. As a result, the shower head 20 functions as an upper electrode. The matcher 22 has the same function as that of the matcher 18.

A processing gas introduction pipe 23 is connected to the shower head 20 that supplies a processing gas, e.g., a mixture gas of CF-based gas and other kind of gas. The processing gas supplied from the processing gas introduction pipe 23 to the shower head 20 is then supplied from the shower head 20 to the processing space S. A first gas analysis unit 35 (first gas analysis apparatus), described later, is connected to the processing gas introduction pipe 23.

In the processing space S in the chamber 10 of the process module 2, the susceptor 11 and the shower head 20 are supplied with the high-frequency power and apply the high-frequency power to the processing space S. In the processing space S, a high density plasma is generated from the processing gas. The generated plasma is focused on a surface of a wafer W by the focus ring 19, and physically or chemically etches the surface of the wafer W, for example.

The loader module 4 includes a wafer-cassette mounting stage 24 on which the wafer cassette 3 is mounted, and includes a transfer chamber 25. In the wafer cassette 3, e.g., twenty-five wafers W are disposed and housed in multistage in equal pitch. The transfer chamber 25 is a rectangular parallel piped box and includes a SCARA-type transfer arm 26 for transferring a wafer W inside the transfer chamber 25.

The transfer arm 26 includes a multi-joint transfer arm portion 27 adapted for being bent/stretched, and a pick 28 mounted to a tip end of the transfer arm portion 27. The pick 28 is configured to be directly mounted with a wafer W. The transfer arm 26 is configured for being turned, and for being bendable/stretchable at the transfer arm portion 27. As a result, the transfer arm 26 can freely transfer a wafer W mounted on the pick 28 between the wafer cassette 3 and the load lock module 5.

The load lock module 5 includes a chamber 30 (second housing chamber) in which a transfer arm 29 configured for being bent/stretched and turned is disposed, and includes a nitrogen gas supply system 31 for supplying nitrogen gas into the chamber 30 and a load lock module exhaust system 32 for exhausting the inside of the chamber 30. A load lock module gas analysis unit 36 (gas analysis apparatus), described later, is connected to the load lock module exhaust system 32. The transfer arm 29 is a SCARA-type transfer arm that is comprised of a plurality of arm portions each having a tip end thereof mounted with a pick 33. The pick 33 is configured to be directly mounted with a wafer W.

To transfer a wafer W from the loader module 4 into the process module 2, the transfer arm 29 receives the wafer W from the transfer arm 26 in the transfer chamber 25, with the gate valve 7 open. Then, the transfer arm 29 enters the chamber 10 of the process module 2 with the gate valve 6 open, and mounts the wafer W on the susceptor 11. To transfer a wafer W from the process module 2 into the loader module 4, the transfer arm 29 enters the chamber 10 of the process module 2 and receives the wafer W from the susceptor 11, with the gate valve 6 open. The transfer arm 29 delivers the wafer W over to the transfer arm 26 in the transfer chamber 25, with the gate valve 7 open.

Operations of the process module 2, the loader module 4, and the load lock module 5, which form the substrate processing system 1, are controlled by a computer (state detection apparatus (not shown)) which is provided as a controller in the substrate processing system 1. Alternatively, the operations are controlled by an external server (state detection apparatus), not shown, connected as a controller to the substrate processing system 1, or the like. The second gas analysis unit 34, the first gas analysis unit 35, and the load lock module gas analysis unit 36 are connected to the computer or the external server.

Figure 2:
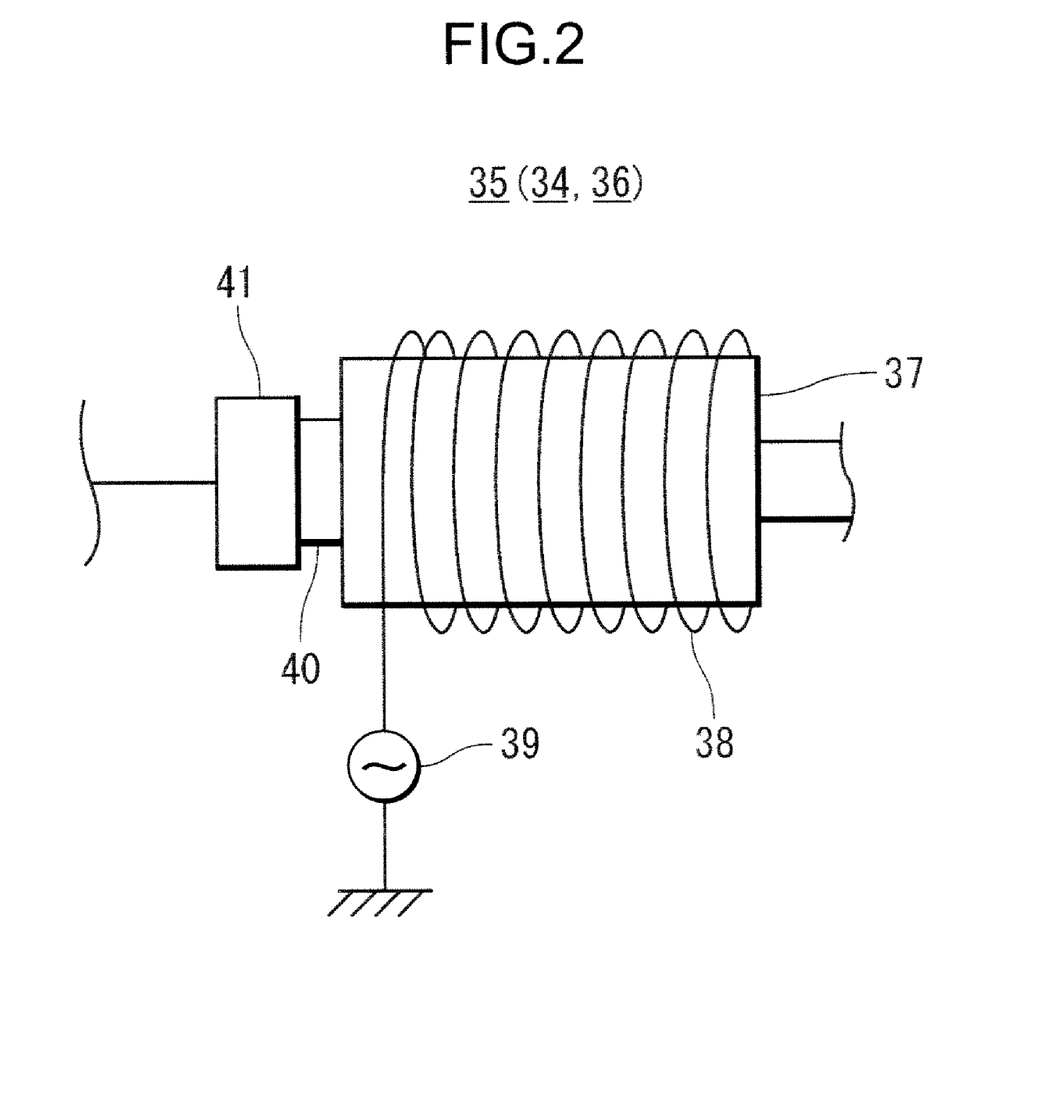
FIG. 2 is a view schematically showing the construction of a second gas analysis unit and the like shown in FIG. 1.

FIG. 2 is a view schematically showing the construction of the second gas analysis unit and the like shown in FIG. 1. Since the second gas analysis unit 34, the first gas analysis unit 35, and the load lock module gas analysis unit 36 are similar in construction to one another, the construction of the first gas analysis unit 35 will be described.

As shown in FIG. 2, the first gas analysis unit 35 includes a sub-chamber 37 (gas take-in chamber) for taking in the processing gas flowing through the processing gas introduction pipe 23, a coil 38 wound around the sub-chamber 37, a high-frequency power supply 39 (plasma generation apparatus) connected to the coil 38, an observation window 40 made of quartz glass and embedded into a wall surface of the sub-chamber 37, a spectroanalyzer 41 (spectroscopic measurement apparatus) disposed such as to face the observation window 40, a gas supply apparatus (not shown) for supplying argon gas into the sub-chamber 37, and an exhaust apparatus (not shown) for exhausting the inside of the sub-chamber 37.

In the first gas analysis unit 35, the high-frequency power supply 39 causes high-frequency current to flow through the coil 38 in order to generate plasma in the sub-chamber 37, and plasma is generated from the argon gas in the sub-chamber 37. The generated plasma excites atoms or molecules in the processing gas in the sub-chamber 37 to thereby cause atoms and molecules to emit light. The spectroanalyzer 41 receives light emitted from atoms or molecules through the observation window 40, disperses the emitted light, and measures the emission intensity of atoms or molecules. Based on the measured emission intensity, the atomic concentration or the molecular concentration of the processing gas is measured. Thus, the first gas analysis unit 35 measures the atomic or molecular concentration of the processing gas flowing through the processing gas introduction pipe 23 (gas before being introduced into the housing chamber).

The second gas analysis unit 34 and the load lock module gas analysis unit 36 have the same construction as the first gas analysis unit 35. The second gas analysis unit 34 measures the concentration of atoms or molecules in the processing gas having passed through the processing space S and then flowing through the manifold 14 (gas having passed through the processing space). The load lock module gas analysis unit 36 measures the concentration of atoms or molecules in the gas flowing through the load lock module exhaust system 32 (gas in the substrate transfer apparatus).

In the process module 2, the mass ratio or the like between various gases, which form the processing gas having passed through the processing space S, can be changed due to consumption of a particular gas (for example, CF-based gas) by being plasmarized or the like in accordance with the state in the processing space S and thus in accordance with the state in the chamber 10. As a result, in the processing gas having passed through the processing space S, there are changes in the concentrations of atoms or molecules that constitute various gases. Therefore, by analyzing the processing gas having passed through the processing space S to thereby measure the concentration of the processing gas, the state in the chamber 10 can be detected.

However, replacement of a part disposed in the chamber 10 (hereinafter referred to as the "inter-chamber part") can cause the state of plasma in the processing space S to change from that observed immediately before the replacement, even if the same plasma processing condition is kept unchanged between before and after the replacement. Therefore, the mode of consumption of the various gases can change. For this reason, even in the same plasma processing condition, the concentration of atoms or molecules in the processing gas having passed through the processing space S can change between before and after the replacement of inter-chamber part. In other words, the atomic or molecular concentration of the processing gas having passed through the processing space S can be influenced by the inter-chamber part replacement. Thus, the inter-chamber part replacement is reflected on the emission intensity of the processing gas having passed through the processing space S and measured by the second gas analysis unit 34.

In order to detect the end point of plasma processing or the like, the second gas analysis unit 34 measures the emission intensity of atoms or molecules of the processing gas having passed through the processing space S during the execution of plasma processing in the chamber 10. Since the plasma must be generated in the sub-chamber 37 for a long time, the observation window 40 is somewhat clouded due to the presence of the plasma or the like. Upon elapse of a predetermined time of use, a sensor of the spectroanalyzer 41 must be replaced. Influences of the cloud on the observation window 40 and of sensor replacement can sometimes be reflected on the emission intensity measured by the second gas analysis unit 34.

In order to accurately detect the state in the chamber 10, it is necessary to remove the influences of the inter-chamber part replacement, the cloud on the observation window 40, and the sensor replacement from the emission intensity measured by the spectroanalyzer 41.

On the other hand, the first gas analysis unit 35 only detects components and the like of the processing gas introduced into the processing space S. In other words, only short time measurement of emission intensity is performed. Since the plasma is generated in the sub-chamber 37 in a short period of time, the observation window 40 is not for a long time in a condition in which the window is subjected to clouding, and therefore it is unnecessary to replace a sensor of the spectroanalyzer 41. Thus, the emission intensity measured by the first gas analysis unit 35 is hardly influenced by the cloud on the observation window 40 and the sensor replacement, and can be utilized as a reference value for a long time.

In view of the above, in the substrate processing apparatus of this embodiment, the emission intensity of the processing gas passing through the processing space S and measured by the second gas analysis unit 34 is calibrated using the emission intensity of the processing gas flowing through the processing-gas introduction pipe 23 and measured by the first gas analysis unit 35.

It is assumed here that plasma processing is continuously performed on a plurality of wafers W in the chamber 10. Under such assumption, a method for calibration of the emission intensity of the processing gas in the substrate processing apparatus of this embodiment will be described.

In this embodiment, it is assumed that the plasma processing is continuously performed on a plurality of wafers W in the processing space S and that the observation window 40 is clouded as a result that the emission intensity of atoms or molecules of the processing gas having passed through the processing space S is measured by the second gas analysis unit 34 during the plasma processing.

Under the above assumption, the observation window 40 is much clouded with elapse of time. As a result, the influence of cloud on the observation window 40 is necessarily reflected on the emission intensity measured by the second gas analysis unit 34 (hereinafter referred to as the "emission intensity after passage through the processing space").

In a time period which is long enough to cloud the observation window 40 of the second gas analysis unit 34, components of the processing gas and an amount of the processing gas introduced into the processing space S can somewhat change due to their variations. Thus, there is a possibility that the emission intensity after passage through the processing space can be influenced not only by the cloud on the observation window 40 but also by a variation in components or the like of the processing gas introduced into the processing space S (hereinafter referred to as the "variation in the processing gas"). It should be noted that the influence of the variation in the processing gas corresponds to the emission intensity measured by the first gas analysis unit 35 before and after the above-mentioned long time period (hereinafter referred to as the "emission intensity before introduction").

In this embodiment, to eliminate the influences of the cloud on the observation window 40 and of the variation in the processing gas, there are utilized the emission intensity before introduction and the emission intensity after passage through the processing space, which are measured before and after execution of the plasma processing on a predetermined number of wafers W.

Specifically, upon start of plasma processing on a wafer W, the emission intensity before introduction and the emission intensity after passage through the processing space are measured at a given wavelength, and a ratio of the emission intensity after passage through the processing space to the emission intensity before introduction (hereinafter referred to as the "initial intensity ratio") is set as an initial value.

Next, after execution of the plasma processing on a plurality of wafers W, the emission intensity before introduction and the emission intensity after passage through the processing space are measured at the above-mentioned wavelength, and a ratio of the emission intensity after passage through the processing space to the emission intensity before introduction (hereinafter referred to as the "temporal intensity ratio") is calculated. At that time, in the second gas analysis unit 34, there is a possibility that the observation window 40 is clouded and the components or the like of the processing gas introduced into the processing space S somewhat change, and therefore, the temporal intensity ratio can differ from the initial intensity ratio. Thus, a correction value for correcting the emission intensity after passage through the processing space measured after the execution of plasma processing on the wafers W (hereinafter referred to as the "correction value for the emission intensity after passage through the processing space") is calculated such that the initial intensity ratio becomes equal to the temporal intensity ratio.

The cloud on the observation window 40 and the presence of the variation in the processing gas can produce a difference between the temporal intensity ratio and the initial intensity ratio. On the other hand, by using the correction value for the emission intensity after passage through the processing space, it is possible to make the temporal intensity ratio equal to the initial intensity ratio. Thus, the correction value for the emission intensity after passage through the processing space represents the influence of the cloud on the observation window 40 and the influence of the variation in the processing gas. The emission intensity after passage through the processing space is corrected by the correction value for the emission intensity after passage through the processing space, thereby eliminating the influences of the cloud on the observation window 40 and the variation in the processing gas for the subsequent observation.

The above described comparison between the initial intensity ratio and the temporal intensity ratio and the calculation of the correction value for the emission intensity after passage through the processing space are performed at various wavelengths.

In a plasma processing condition which is the same as or similar to that in which the state in the chamber 10 is detected, the emission intensity after passage through the processing space is measured. The emission intensity after passage through the processing space reflects the influence of the cloud on the observation window 40 and the influence of the variation in the processing gas. Nevertheless, by correcting the emission intensity after passage through the processing space with the correction value for the emission intensity after passage through the processing space, the influence of the cloud on the observation window 40 and the influence of the variation in the processing gas can be eliminated, making it possible to obtain the emission intensity that really represents the state in the chamber 10.

It is known that the following detections and estimations can be carried out based on the emission intensity that really represents the state in the chamber 10. The following detections and estimations are implemented by a computer or an external server to which an electrical signal representing the emission intensity is supplied from the second gas analysis unit 34 or the first gas analysis unit 35.

Estimation of deposit components in the chamber 10

Estimation of deposit amount in the chamber 10

Detection of etching end point

Detection of seasoning end point

Detection of atmospheric air leakage

Detection of helium gas leakage

Detection of moisture in the chamber 10

Detection of contamination in the chamber 10

Estimation of changes in process parameters and detection of abnormality of process parameters Estimation of a property of a wafer W and detection of abnormality of the property of the wafer W Estimation of an amount of consumption of an inter-chamber part Diagnosis of individual difference between chambers 10 or between process modules 2

Next, an explanation will be given of a plasma processing end point detection method as an analysis method for the substrate processing apparatus of this embodiment in which the above described emission intensity calibration method is used. Also in the following description, it is assumed the case where the plasma processing is continuously performed on a plurality of wafers W, the second gas analysis unit 34 measures the emission intensity of atoms or molecules in the processing gas having passed through the processing space S, and as a result, the observation window 40 is clouded.

Figure 3:
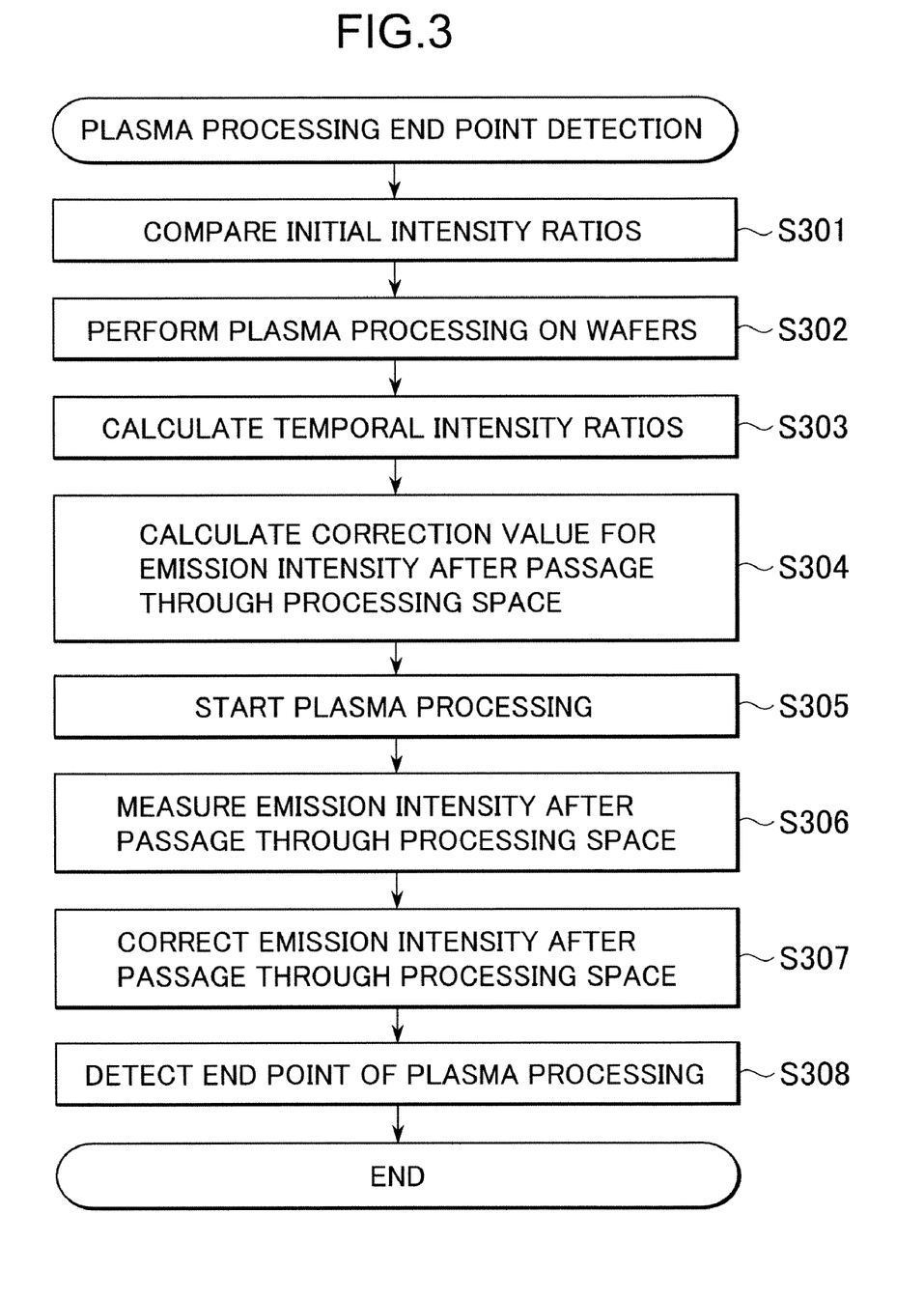
FIG. 3 is a flowchart showing a plasma processing end point detection method as an analysis method for a substrate processing apparatus according to the first embodiment.

FIG. 3 is a flowchart showing a plasma processing end point detection method as an analysis method for the substrate processing apparatus of this embodiment.

As shown in FIG. 3, upon start of the plasma processing on a wafer W, the emission intensity before introduction and the emission intensity after passage through the processing space are measured at various wavelengths, and initial intensity ratios between them are set (step S301).

Then, the plasma processing is performed on a plurality of wafers W (step S302), the emission intensity before introduction and the emission intensity after passage through the processing space are measured at various wavelengths, and temporal intensity ratios of them are calculated (step S303). Furthermore, the comparison between the initial intensity ratio and the temporal intensity ratio and the calculation of a correction value for the emission intensity after passage through the processing space are performed for each of various wavelengths (step S304).

Next, the plasma processing is started in a plasma processing condition corresponding to that where the state in the chamber 10 is detected (step S305), the emission intensity after passage through the processing space is measured at each wavelength (step S306), and the emission intensity after passage through the processing space is corrected using the calculated correction value for the emission intensity after passage through the processing space (step S307), whereby the emission intensity that really represents the state in the chamber 10 is calculated for each wavelength.

Next, the end point of the plasma processing is detected based on the calculated emission intensity (step S308), whereupon the present process is completed.

In the process shown in FIG. 3, the emission intensity before introduction and the emission intensity after passage through the processing space are measured before and after execution of the plasma processing on a plurality of wafers W, the correction value for the emission intensity after passage through the processing space is calculated, and the emission intensity after passage through the processing space is corrected with the calculated correction value for the emission intensity after passage through the processing space. As described above, the correction value for the emission intensity after passage through the processing space corresponds to the influence of the cloud on the observation window 40 and the influence of the variation in the processing gas. As a consequence, the influence of the cloud on the observation window 40 and the influence of the variation in the processing gas can be removed from the emission intensity after passage through the processing space, whereby the emission intensity that really represents the state in the chamber 10 is calculated. As a result, the state in the chamber 10 can accurately be detected, and therefore, the end point of the plasma processing can be detected with accuracy.

Next, a substrate processing system to which is applied a substrate processing apparatus of a second embodiment of this invention will be explained.

This embodiment is conceptually the same in construction and function as the above described first embodiment, and only differs therefrom in envisaged circumstances. Hence, only the constructions and functions of this embodiment different from the first embodiment are explained, with explanations on the same or similar construction omitted.

In this embodiment, only circumstances immediately before and after replacement of an inter-chamber part (before and after maintenance of the housing chamber) are considered, without considering circumstances before and after generation of cloud on the observation window 40 and circumstances before and after replacement of a sensor in the spectroanalyzer 41. In the following, an explanation will be given of a method for calibration of the emission intensity of processing gas in the substrate processing apparatus of this embodiment under the above described circumstances.

Figure 4:
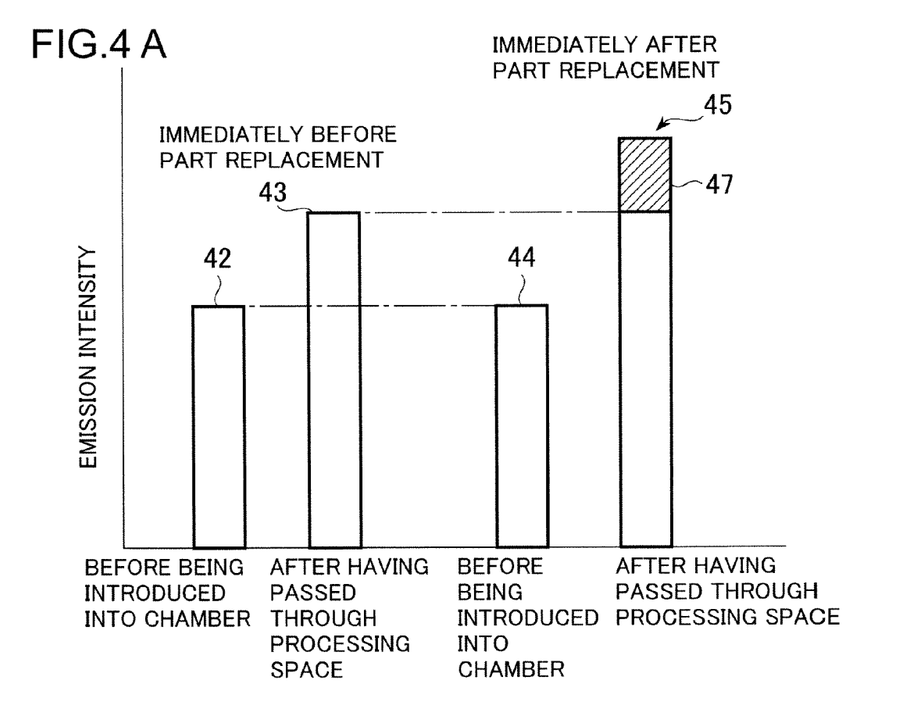
FIG. 4A is a view showing a variation in the emission intensity of processing gas having passed through the processing space caused by replacement of an inter-chamber part.
FIG. 4B is a view showing the emission intensity of the processing gas after calibration using the variation shown in FIG. 4A.

FIGS. 4A and 4B are views for explaining the method for calibrating the emission intensity of the processing gas in the substrate processing apparatus of this embodiment. FIG. 4A is a view showing a variation in the emission intensity of the processing gas having passed through the processing space caused by replacement of an inter-chamber part, and FIG. 4B is a view showing the emission intensity of the processing gas after calibration using the variation shown in FIG. 4A.

As shown in FIG. 4A, a plasma is generated in the processing space S immediately before the replacement of the inter-chamber part. Then, the emission intensity 42 of the processing gas flowing through the processing gas introduction pipe 23 is measured by the first gas analysis unit 35, and the emission intensity 43 of the processing gas having passed through the processing space S is measured by the second gas analysis unit 34.

Next, immediately after the inter-chamber part replacement, the emission intensity 44 of the processing gas flowing through the processing gas introduction pipe 23 is measured by the first gas analysis unit 35, and the emission intensity 45 of the processing gas having passed through the processing space S is measured by the second gas analysis unit 34.

The processing gas flowing through the processing gas introduction pipe 23 has not passed through the processing space S. Thus, the atomic or molecular concentration of the processing gas flowing through the processing gas introduction pipe 23 never be influenced by the inter-chamber part replacement. If the emission intensity 44 is equal to the emission intensity 42, this indicates that the plasma processing condition immediately after the inter-chamber part replacement coincides with that immediately before the inter-chamber part replacement. If the emission intensity 44 is not equal to the emission intensity 42, this indicates there is an abnormality of components of or an introduction amount of the processing gas introduced into the processing space S, or there is a fault of the spectroanalyzer 41 in the first gas analysis unit 35.

When the emission intensity 44 is equal to the emission intensity 42, a difference between the emission intensities 45 and 43 measured by the second gas analysis unit 34 immediately after and immediately before the inter-chamber part replacement represents a variation 47 caused by the influence of the inter-chamber part replacement because there hardly occurs a temporal deterioration of the second gas analysis unit 34 (generation of cloud on the observation window 40 and replacement of a sensor of the spectroanalyzer 41) in a period between immediately before and after the inter-chamber part replacement. Thus, it is possible to determine the variation 47 in the emission intensity representing the influence of the inter-chamber part replacement for the case where the emission intensities 44, 42 measured by the first gas analysis unit 35 are equal to each other.

As shown in FIG. 4B, in the plasma processing condition corresponding to the condition in which the state in the chamber 10 is detected, the emission intensity 48 of the processing gas having passed through the processing space S is measured by the second gas analysis unit 34. The emission intensity 48 includes the variation 47 in the emission intensity corresponding to the influence of the inter-chamber part replacement. Therefore, by eliminating the variation 47 in the emission intensity from the emission intensity 48, the emission intensity 49 that really represents the state in the chamber 10 can be determined.

Even when the sensor of the spectroanalyzer 41 is replaced, the variation 47 in the emission intensity corresponding to the influence of the sensor replacement can similarly be determined by measuring the emission intensities 42, 43, 44, 45 immediately before and after the sensor replacement. As a result, the emission intensity 49 that really represents the state in the chamber 10 can be determined.

Next, an explanation will be given of a plasma processing end point detection method as an analysis method for the substrate processing apparatus of this embodiment, in which the above described method for calibration of the emission intensity is used. In the following, only the circumstances immediately before and after the inter-chamber part replacement are considered, whereas circumstances before and after generation of cloud on the observation window 40 and circumstances before and after the replacement of sensor of the spectroanalyzer 41 are not considered.

Figure 5:
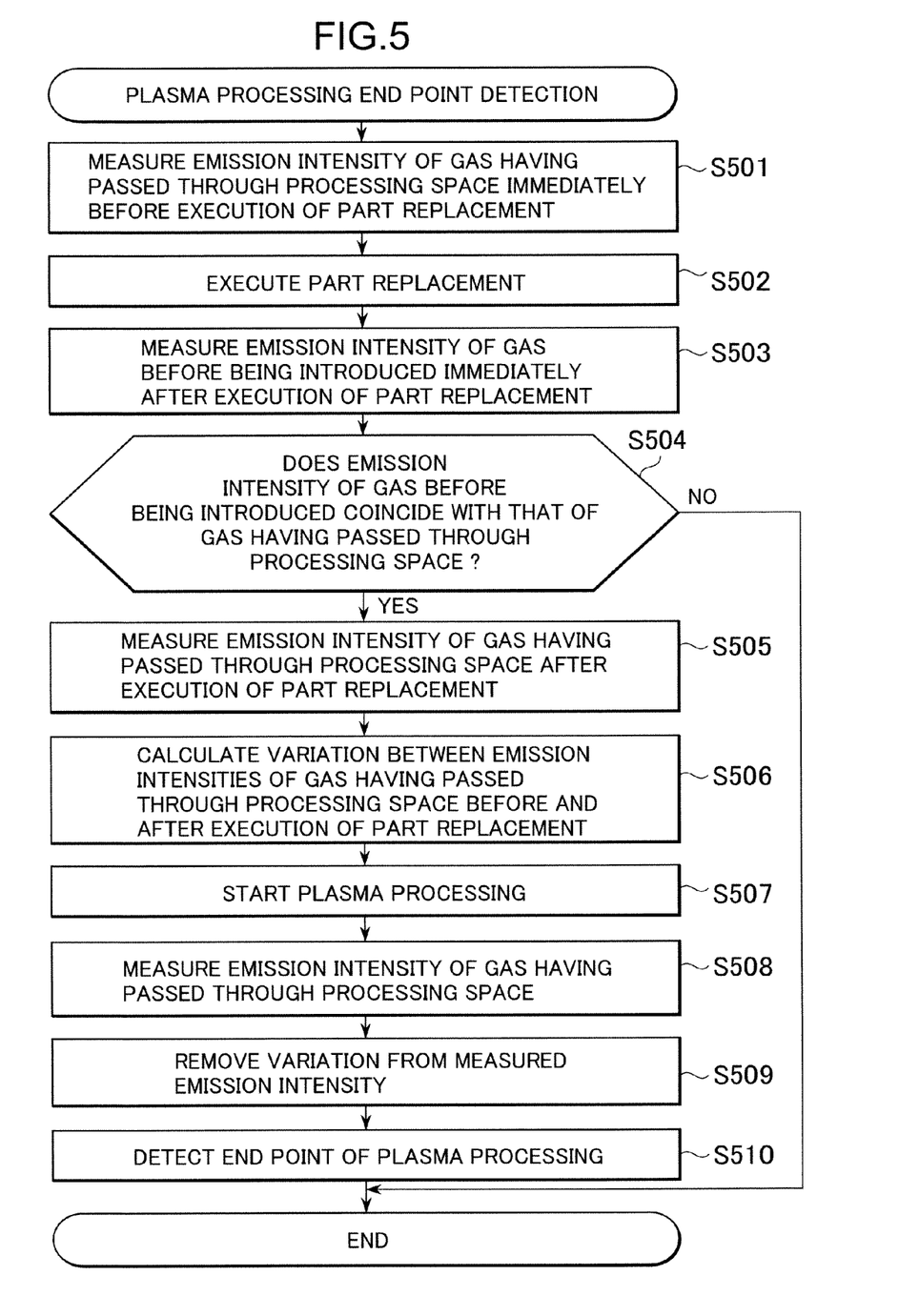
FIG. 5 is a flowchart showing a plasma processing end point detection method as an analysis method for the substrate processing apparatus of the second embodiment.

FIG. 5 is a flowchart showing a plasma processing end point detection method as an analysis method for the substrate processing apparatus of this embodiment.

As shown in FIG. 5, a plasma is generated in the processing space S immediately before the replacement of an inter-chamber part, the emission intensity 42 of processing gas flowing through the processing-gas introduction pipe 23 is measured by the first gas analysis unit 35, and the emission intensity 43 of processing gas having passed through the processing space S is measured by the second gas analysis unit 34 (step S501).

Next, an inter-chamber part (for example, a sealed ring or a focus ring 19) is replaced (step S502). Immediately after the replacement, a plasma is generated in the processing space S, and the emission intensity 44 of the processing gas flowing through the processing-gas introduction pipe 23 is measured by the first gas analysis unit 35 (step S503).

Next, a determination is made as to whether or not the emission intensity 44 measured in step S503 coincides with the emission intensity 42 measured in step S501 (step S504). If it is determined that these emission intensities do not coincide with each other, then the present process is completed, determining that there occurs an abnormality relating to the processing gas introduced into the processing space S or a failure of the spectroanalyzer 41. On the other hand, if it is determined that emission intensities coincide with each other, the emission intensity 45 of the processing gas having passed through the processing space S is measured by the second gas analysis unit 34 (step S505), and a difference between the measured emission intensity 45 and the emission intensity 43 measured in step S501 is calculated (step S506). As described in the above, this difference is a variation 47 corresponding to the influence of the inter-chamber part replacement.

Next, a wafer W is housed in the chamber 10, and then the execution of plasma processing on the wafer W in the predetermined plasma processing condition is started (step S507). The emission intensity 48 of the processing gas having passed through the processing space S is measured by the second gas analysis unit 34 (step S508). Then, the variation 47 in the emission intensity is removed from the emission intensity 48 (step S509), thereby calculating the emission intensity 49 that really represents the state in the chamber 10.

Next, the end point of plasma processing is detected based on the emission intensity 49 (step S510), whereupon the present process is completed.

In the process shown in FIG. 5, when the emission intensities 42, 44 of the processing gas flowing through the processing gas introduction pipe 23 and measured immediately before and after the inter-chamber part replacement coincide with each other, the variation 47 between the emission intensities 43,45 of the processing gas having passed through the processing space S immediately before and after the inter-chamber part replacement is calculated, and the variation 47 is removed from the emission intensity 48 of the processing gas having passed through the processing space S during the plasma processing on the wafer W, thereby calculating the emission intensity 49 that really represents the state in the chamber 10.

When the emission intensities 42, 44 measured immediately before and after the inter-chamber part replacement coincide with each other, the variation 47 between the emission intensity 45 measured by the second gas analysis unit 34 immediately after the inter-chamber part replacement and the emission intensity 43 measured immediately before the inter-chamber part replacement corresponds to the influence of the inter-chamber part replacement. Therefore, by removing the variation 47 from the emission intensity 48 measured during the plasma processing on the wafer W, it is possible to calculate the emission intensity 49 that really represents the state in the chamber 10. As a result, the state in the chamber 10 can accurately be detected, thereby accurately detecting the end point of plasma processing.

It should be noted that even when the sensor of the spectroanalyzer 41 is replaced, or the inter-chamber part is cleaned, or the inside of the chamber 10 is dry-cleaned, the emission intensity 49 that really represents the state in the chamber 10 can be determined by executing the process shown in FIG. 5, making it possible to accurate detect the state in the chamber 10.

In the above described substrate processing system 1 of FIG. 1, the second gas analysis unit 34 is connected to the manifold 14 of the process module exhaust system, whereby the second gas analysis unit 34 is isolated from the inside of the chamber 10. Thus, it is possible to prevent the analysis processing in the second gas analysis unit 34 (for example, plasma generation processing) from influencing the plasma processing or the like in the chamber 10.

The manifold 14 to which the second gas analysis unit 34 is connected is disposed in a space located downstream of the flow straightener ring 13 in the process module exhaust system and upstream of the TMP 16. To allow the TMP 16 to execute the exhaustion, nitrogen gas must be supplied to the downstream side of the TMP 16. However, since the second gas analysis unit 34 is disposed upstream of the TMP 16, the emission intensity 48 measured as the atomic or molecular concentration of the processing gas having passed through the processing space S is not influenced by the supplied nitrogen gas. Since the second gas analysis unit 34 is disposed downstream of the flow straightener ring 13, the emission intensity 48 is not influenced by plasma, making it possible to more accurately detect the state in the chamber 10.

In the first and second gas analysis units 35, 34, a plasma is generated in the sub-chamber 37, the generated plasma excites atoms or molecules in the processing gas taken in from the manifold 14 or from the processing gas introduction pipe 23, thereby causing the atoms or molecules to emit light.

The light emitted therefrom is dispersed and the emission intensity of the atoms or molecules is measured, making it possible to measure the atomic or molecular concentration of the processing gas.

Since the high frequency power required for plasma generation in the first and second gas analysis units 35, 34 is small such as in the order of several watts, the cloud on the observation window 40 and the deterioration of the observation window hardly occur. Thus, by using the second gas analysis unit 34 or the like, the emission intensity of atoms or molecules can accurately be measured.

In the first and second gas analysis units 35, 34, since the inside of the sub-chamber 37 is exhausted by the exhaust apparatus, the processing gas having been subjected to spectral analysis can be prevented from being accumulated in the sub-chamber 37, making it possible to accurately measure the emission intensity of atoms or molecules in the processing gas.

A time period required to execute spectral analysis in the second gas analysis units 34 or the like is not necessarily the same as a time period required for plasma processing in the chamber 10. Thus, it is possible to reduce the time period during which a plasma is generated in the sub-chamber 37 to a minimum, making it possible to decrease the time period to a minimum during which a high frequency current is caused to flow through the coil 38.

In the above described substrate processing system 1, gas in the chamber 30 of the load lock module 5 flows into the load lock module exhaust system 32 of the load lock module 5, and the load lock module gas analysis unit 36 takes in the gas flowing through the load lock module exhaust system 32 and measures the atomic or molecular concentration of the gas based on the emission intensity of the atoms or molecules in the gas. The atomic or molecular concentration of the gas in the chamber 30 reflects the state in the chamber 30. Accordingly, it is possible to detect the state in the chamber 30 of the load lock module 5.

It is known that the following detections and estimations can be carried out based on the emission intensity of gas in the chamber 30. The detections and estimations are implemented by a computer or an external server to which an electrical signal representing the emission intensity is transmitted from the load lock module gas analysis unit 36.

Detection of components or concentration of processing gas flowing from the process module 2 to the chamber 340 of the load lock module 5

Detection of components of material absorbed onto a wafer W before plasma processing Detection of an end point of purging of moisture or processing gas (for example, CF-based gas) from a wafer W Detection of Atmospheric Air Leakage The load lock module gas analysis unit 36 is connected to the load lock module exhaust system 32, whereby the load lock module gas analysis unit 36 can be isolated from the inside of the chamber 30, making it possible to prevent the analysis processing in the load lock module gas analysis unit 36 from influencing the inside of the chamber 30 of the load lock module 5.

In the above described substrate processing system 1, the second gas analysis unit 34 is connected to the manifold 14. However, the place to which the second gas analysis unit 34 is connected is not limited thereto. The second gas analysis unit 34 can be connected at any part of the process module exhaust system or can be connected to the chamber 10. Thus, the second gas analysis unit 34 can easily take in the processing gas having passed through the processing space S, making it possible to easily detect the state in the chamber 10.

The load lock module gas analysis unit 36 is connected to the load lock module exhaust system 32, but can be connected to the chamber 30. In that case, the load lock module gas analysis unit 36 can easily take in gas in the chamber 30. As a result, the state in the chamber 30 can be detected with ease.

The above described second gas analysis unit 34, the first gas analysis unit 35, and the load lock module gas analysis unit 36 each have the sub-chamber 37 for plasma generation incorporated therein. However, the construction of the second gas analysis unit 34 and the like is not limited thereto. As the second gas analysis unit 34, a gas mass analyzer or a Fourier transform infrared spectrophotometer (FTIR) can be employed, thereby making it possible to more accurately measure the atomic or molecular concentration of processing gas or gas in the chamber 30.

Figure 6:
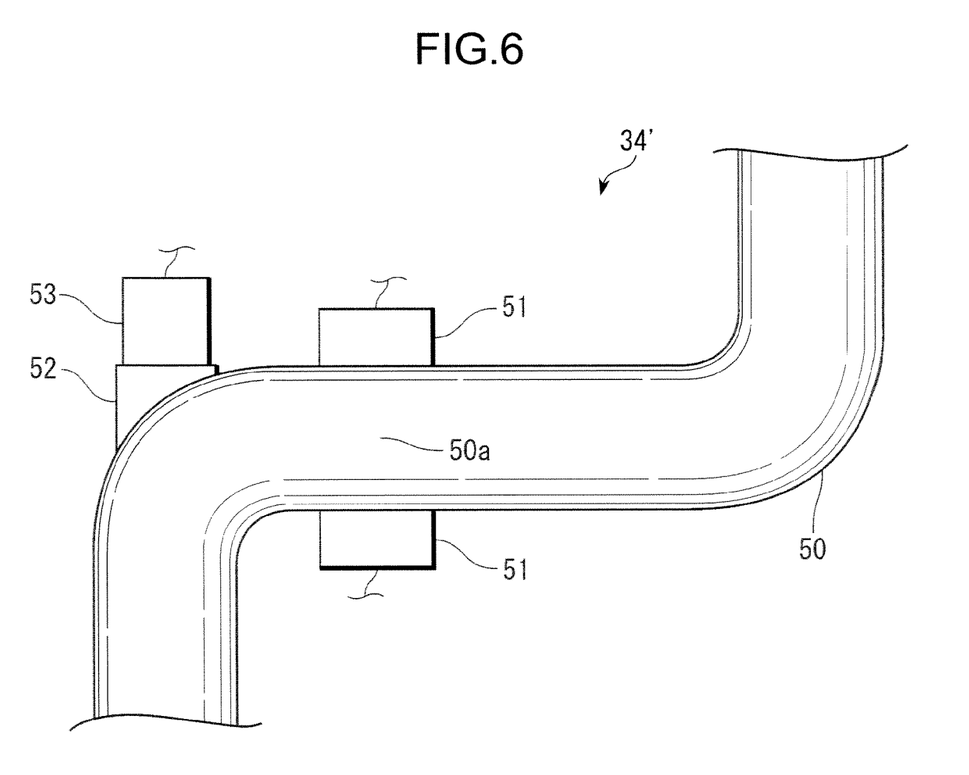
FIG. 6 is a view schematically showing the construction of a modification of the second gas analysis unit and the like shown in FIG. 2.

The second gas analysis unit 34 can be one not provided with a sub-chamber but adapted for plasma generation. Specifically, as shown in FIG. 6, a second gas analysis unit 34' includes a crank-shaped curved pipe 50 (gas pipe, for example, part of the process module exhaust system) through which processing gas flows, a plasma generation apparatus 51 for generating a plasma in the curved pipe 50, an observation window 52 of quartz glass embedded in a wall surface of the curved pipe 50, and a spectroanalyzer 53 (spectroscopic measurement apparatus) disposed such as to face the observation window 52.

In this second gas analysis unit 34', the spectroanalyzer 53 receives via the observation window 52 an afterglow appearing downstream of the central part 50a of plasma generation in the curved pipe 50 and disperses the afterglow to thereby measure the emission intensity. Then, based on a result of the measurement, the atomic or molecular concentration is measured.

With the second gas analysis unit 34', the afterglow appearing at a location downstream of the plasma generation center part 50a in the curved pipe 50 is dispersed for emission intensity measurement. Thus, the emission intensity can accurately be measured. In addition, since no sub-chamber for taking in the processing gas is required, the processing gas analysis can be carried out with a low-priced construction. It should be noted that the first gas analysis unit 35 and the load lock module gas analysis unit 36 can have the same construction as the second gas analysis unit 34'.

A gas analysis unit having the same or similar construction to that of the load lock module gas analysis unit 36 can also be employed for detection of a state in the loader module 4 or in the wafer cassette 3.

The analysis method for the substrate processing apparatus of this embodiment in which the above described emission intensity calibration method is used is applied to the detection of the end point of plasma processing. However, the object of end point detection is not limited thereto, but can be COR (chemical oxide remove) processing or PHT (post heat treatment) processing.

It is to be understood that the present invention may also be accomplished by supplying to a computer or an external server a storage medium in which is stored a program code of software that realizes the functions of the above described embodiments, and then causing a CPU of the computer or the like to read out and execute the program code stored in the storage medium.

In this case, the program code itself read out from the storage medium realizes the functions of the embodiments, and hence the program code and the storage medium in which the program code is stored constitute the present invention.

The storage medium for supplying the program code may be, for example, a RAM, an NV-RAM, a floppy (registered trademark) disk, a hard disk, a magnetic-optical disk, an optical disk such as a CD-ROM, a CD-R, a CD-RW, a DVD (DVD-ROM, DVD-RAM, DVD-RW, or DVD+RW), a magnetic tape, a non-volatile memory card, or a ROM. Alternatively, the program code may be supplied to the computer or the like by being downloaded via a network from another computer, a database, or the like, not shown, connected to the Internet, a commercial network, a local area network, or the like.

Moreover, it is to be understood that the functions of the embodiments can be accomplished not only by executing a program code read out by the computer or the like, but also by causing an OS (operating system) or the like which operates on the CPU to perform a part or all of the actual operations based on instructions of the program code.

Furthermore, it is to be understood that the functions of the embodiments can also be accomplished by writing a program code read out from a storage medium into a memory provided on an expansion board inserted into the computer or in an expansion unit connected to the computer and then causing a CPU or the like provided on the expansion board or in the expansion unit to perform a part or all of the actual operations based on instructions of the program code.

The form of the program code may be an object code, a program code executed by an interpreter, script data supplied to an OS, or the like.

What is claimed is:

1. A substrate processing apparatus including a housing chamber adapted to house a substrate and a gas introduction apparatus adapted to introduce gas into the housing chamber, the housing chamber including a processing space in which predetermined processing is performed on the substrate using the gas, comprising:
   a first gas analysis apparatus adapted to analyze gas before being introduced into the housing chamber;
   a second gas analysis apparatus adapted to analyze gas having passed through the processing space; and
   a state detection apparatus adapted to detect a state in the housing chamber based on a result of analysis on the gas before being introduced into the housing chamber and a result of analysis on the gas having passed through the processing space,
   wherein the state detection apparatus calculates a ratio of the result of analysis performed on the gas having passed through the processing space before execution of the predetermined processing on a plurality of the substrates to the result of analysis performed on the gas before being introduced into the housing chamber before the execution of the predetermined processing on the plurality of the substrates, calculates a ratio of the result of analysis performed on the gas having passed through the processing space after the execution of the predetermined processing on the plurality of the substrates to the result of analysis performed on the gas before being introduced into the housing chamber after the execution of the predetermined processing on the plurality of the substrates, calculates a correction value for correcting the result of analysis performed on the gas having passed through the processing space after the execution of the predetermined processing on the plurality of the substrates such that the ratio before the execution of the predetermined processing on the plurality of the substrates and the ratio after the execution of the predetermined processing on the plurality of the substrates become equal to each other, and calibrates the result of analysis on the gas having passed through the processing space using the calculated correction value.

2. The substrate processing apparatus according to claim 1, wherein the state detection apparatus detects an end point of the predetermined processing based on the calibrated result of analysis on the gas having passed through the processing space.

3. The substrate processing apparatus according to claim 1, wherein said second gas analysis apparatus is disposed in the housing chamber.

4. The substrate processing apparatus according to claim 1, wherein at least one of said first and second gas analysis apparatuses has a gas take-in chamber for taking in gas, a plasma generation apparatus for generating plasma in the gas take-in chamber, and a spectroscopic measurement apparatus for dispersing light emitted from atoms or molecules in the gas excited by the plasma and measuring an emission intensity.

5. The substrate processing apparatus according to claim 1, wherein at least one of said first and second gas analysis apparatuses is a mass analyzer.

6. The substrate processing apparatus according to claim 1, wherein at least one of said first and second gas analysis apparatuses is a Fourier transform infrared spectrophotometer.

7. The substrate processing apparatus according to claim 1, wherein at least one of said first and second gas analysis apparatuses includes a gas pipe through which the gas flows, a plasma generation apparatus for generating plasma in the gas pipe, and a spectroscopic measurement apparatus for dispersing an afterglow appearing downstream of a center part of plasma generation in the gas pipe and measuring an emission intensity.

8. The substrate processing apparatus according to claim 1, including an exhaust system adapted to exhaust an inside of the housing chamber,
   wherein said second gas analysis apparatus is disposed in said exhaust system.

9. The substrate processing apparatus according to claim 8, wherein the housing chamber has an exhaust plate for preventing the plasma in the processing space from flowing toward a downstream side, said exhaust system has a high molecular vacuum pump, and said second gas analysis apparatus is disposed between the exhaust plate and the high molecular vacuum pump.

10. The substrate processing apparatus according to claim 1, wherein a substrate transfer apparatus for transferring the substrate into and out of the substrate processing apparatus is connected to the substrate processing apparatus, and
    the substrate transfer apparatus has a gas analysis apparatus for analyzing gas in said substrate transfer apparatus.

11. The substrate processing apparatus according to claim 10, wherein said substrate transfer apparatus has a second exhaust system for exhausting gas in the substrate transfer apparatus, and said gas analysis apparatus is disposed in said second exhaust system.

12. The substrate processing apparatus according to claim 10, wherein said substrate transfer apparatus has a second housing chamber for temporarily housing the substrate, and said gas analysis apparatus is disposed in said second housing chamber.

13. A substrate processing apparatus having a housing chamber for housing a substrate and a gas introduction apparatus for introducing gas into the housing chamber, the housing chamber having a processing space in which predetermined processing is performed on the substrate using the gas, comprising:
    a first gas analysis apparatus adapted to analyze gas before being introduced into the housing chamber;

a second gas analysis apparatus adapted to analyze gas having passed through the processing space; and a state detection apparatus adapted to detect a state in the housing chamber based on a result of analysis on the gas before being introduced into the housing chamber and a result of analysis on the gas having passed through the processing space, wherein said state detection apparatus calculates a variation between the results of analysis performed on the gas having passed through the processing space before and after maintenance of the housing chamber when the result of analysis performed on the gas before being introduced into the housing chamber before the maintenance of the housing chamber is equal to the result of analysis performed thereon after the maintenance of the housing chamber, and calibrates the result of analysis on the gas having passed through the processing space using the calculated variation.

14. The substrate processing apparatus according to claim 13, wherein the maintenance of the housing chamber includes replacing parts, cleaning parts, or performing dry cleaning of the housing chamber.

15. An analysis method for a substrate processing apparatus having a housing chamber for housing a substrate and a gas introduction apparatus for introducing gas into the housing chamber, the housing chamber having a processing space in which predetermined processing is performed on the substrate using the gas, comprising:

a first gas analyzing step of analyzing gas before being introduced into the housing chamber;

a second gas analyzing step of analyzing gas having passed through the processing space; and a state detection step of detecting a state in the housing chamber based on a result of analysis on the gas before being introduced into the housing chamber and a result of analysis on the gas having passed through the processing space, wherein said state detection step calculates a ratio of the result of analysis performed on the gas having passed through the processing space before execution of the predetermined processing on a plurality of the substrates to the result of analysis performed on the gas before being introduced into the housing chamber before the execution of the predetermined processing on the plurality of the substrates, calculates a ratio of the result of analysis performed on the gas having passed through the processing space after the execution of the predetermined processing on the plurality of the substrates to the result of analysis performed on the gas before being introduced into the housing chamber after the execution of the predetermined processing on the plurality of the substrates, calculates a correction value for correcting the result of analysis performed on the gas having passed through the processing space after the execution of the predetermined processing on the plurality of the substrates such that the ratio before the execution of the predetermined processing on the plurality of the substrates and the ratio after the execution of the predetermined processing on the plurality of the substrates become equal to each other, and calibrates the result of analysis on the gas having passed through the processing space using the calculated correction value.

16. The analysis method according to claim 15, wherein said state detection step detects an end point of the predetermined processing based on the calibrated result of analysis on the gas having passed through the processing space.

17. An analysis method for a substrate processing apparatus having a housing chamber for housing a substrate and a gas introduction apparatus for introducing gas into the housing chamber, the housing chamber having a processing space in which predetermined processing is performed on the substrate using the gas, comprising:

a first gas analyzing step of analyzing gas before being introduced into the housing chamber;

a second gas analyzing step of analyzing gas having passed through the processing space; and a state detection step of detecting a state in the housing chamber based on a result of analysis on the gas before being introduced into the housing chamber and a result of analysis on the gas having passed through the processing space, wherein said state detection step calculates a variation between the results of analysis performed on the gas having passed through the processing space before and after maintenance of the housing chamber when the result of analysis performed on the gas before being introduced into the housing chamber before the maintenance of the housing chamber is equal to the result of analysis performed thereon after the maintenance of the housing chamber, and calibrates the result of analysis on the gas having passed through the processing space using the calculated variation.

18. The analysis method according to claim 17, wherein the maintenance of the housing chamber includes replacing parts, cleaning parts, or performing dry cleaning of the housing chamber.

* * * * *